United States Patent
Zhang

(10) Patent No.: US 11,876,495 B2
(45) Date of Patent: Jan. 16, 2024

(54) WORKING STATE ADJUSTMENT METHOD AND APPARATUS, TERMINAL AND STORAGE MEDIUM

(71) Applicant: Beijing Xiaomi Mobile Software Co., Ltd., Beijing (CN)

(72) Inventor: Jingshan Zhang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 30 days.

(21) Appl. No.: 17/703,190

(22) Filed: Mar. 24, 2022

(65) Prior Publication Data

US 2023/0079103 A1    Mar. 16, 2023

(30) Foreign Application Priority Data

Sep. 16, 2021 (CN) .......................... 202111089196.2

(51) Int. Cl.
| H03F 1/42 | (2006.01) |
| H03F 3/24 | (2006.01) |
| H03F 1/02 | (2006.01) |
| H04W 52/18 | (2009.01) |

(52) U.S. Cl.
CPC ........... H03F 3/245 (2013.01); H03F 1/0233 (2013.01); H03F 1/42 (2013.01); H04W 52/18 (2013.01); H03F 2200/451 (2013.01)

(58) Field of Classification Search
CPC .......... H03F 3/245; H03F 1/42; H03F 1/0233; H03F 2200/451
See application file for complete search history.

(56) References Cited

U.S. PATENT DOCUMENTS

| 8,818,305 | B1* | 8/2014 | Schwent | H03F 1/0227 |
| | | | | 455/574 |
| 9,692,366 | B2* | 6/2017 | Pilgram | H03F 3/24 |
| 11,228,282 | B2* | 1/2022 | Wang | H03F 1/0216 |
| 11,330,537 | B2* | 5/2022 | Park | H03F 3/72 |
| 11,368,133 | B2* | 6/2022 | Camuffo | H03F 1/32 |
| 11,394,412 | B2* | 7/2022 | Menkhoff | H03F 1/3247 |
| 2016/0164550 | A1* | 6/2016 | Pilgram | H03F 3/19 |
| | | | | 375/295 |
| 2020/0119705 | A1* | 4/2020 | Camuffo | H04W 52/02 |
| 2020/0313634 | A9* | 10/2020 | Camuffo | H04L 27/04 |
| 2020/0382147 | A1* | 12/2020 | Menkhoff | H03F 3/195 |
| 2021/0050819 | A1* | 2/2021 | Wang | H03F 3/3061 |
| 2021/0091732 | A1* | 3/2021 | Camuffo | H04W 52/02 |
| 2021/0105729 | A1* | 4/2021 | Park | H03F 3/245 |

OTHER PUBLICATIONS

Extended European Search Report dated Sep. 22, 2022 for European Patent Application No. 22165127.6.

* cited by examiner

*Primary Examiner* — Hai V Nguyen
(74) *Attorney, Agent, or Firm* — Volpe Koenig

(57) ABSTRACT

A working state adjustment method is applied to a terminal. A power amplifier (PA) is arranged on the terminal. The method includes: determining a target channel bandwidth in which the terminal works; determining a target working state in which the PA works among optional working states according to the target channel bandwidth, in which the optional working states correspond to at least two types of working modes respectively; and adjusting the PA to work in the target working state.

19 Claims, 3 Drawing Sheets

WORKING STATE ADJUSTMENT METHOD AND APPARATUS, TERMINAL AND STORAGE MEDIUM

CROSS REFERENCE TO RELATED APPLICATIONS

The present application is provided based on and claims the benefit of priority to Chinese Patent Application No. 202111089196.2, filed on Sep. 16, 2021, the contents of which are incorporated herein by reference in their entireties for all purposes.

BACKGROUND

At present, many terminals are based on a high-pass system platform and integrated with a power amplifier (PA) provided by a third party.

SUMMARY

The disclosure relates to the technical field of terminals, in particular to a working state adjustment method and apparatus, a terminal and a storage medium.

According to a first aspect of an example of the disclosure, a working state adjustment method is provided and applied to a terminal. A power amplifier (PA) is arranged on the terminal. The method includes:

determining a target channel bandwidth in which the terminal works;

determining a target working state in which the PA works among optional working states according to the target channel bandwidth, in which the optional working states correspond to at least two types of working modes respectively; and adjusting the PA to work in the target working state.

According to a second aspect of an example of the disclosure, a terminal is provided and includes:

a power amplifier (PA); and a working state adjustment module, configured to adjust a working state of the PA by using any method above.

According to a third aspect of an example of the disclosure, a computer readable storage medium is provided and stores a computer program. When the computer program is executed by a processor, steps of any working state adjustment method above are implemented.

According to a fourth aspect of an example of the disclosure, a working state adjustment apparatus is provided and includes:

a processor; and a memory, configured to store an instruction executable by the processor.

The processor is configured to execute the executable instruction so as to implement steps of any working state adjustment method above.

It can be understood that the above general description and the following detailed description are only illustrative and explanatory instead of limiting the disclosure.

BRIEF DESCRIPTION OF THE DRAWINGS

Accompanying drawings here, which are incorporated in and constitute a part of the specification, illustrate examples consistent with the disclosure and, together with the specification, serve to explain principles of the disclosure.

DETAILED DESCRIPTION

Figure 1:
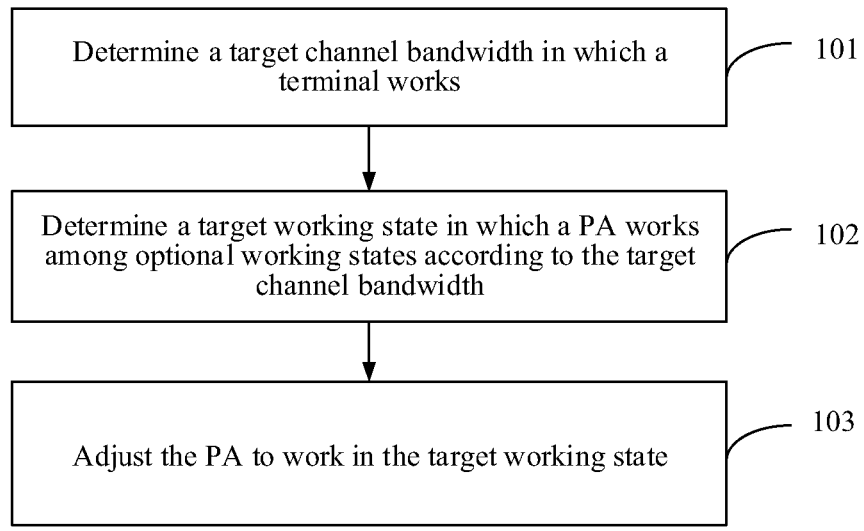
FIG. 1 is a flowchart of a working state adjustment method shown by an illustrative example of the disclosure.

The illustrative examples will be described here in detail, whose instances are represented in the drawings. When the following description concerns the drawings, the same number in the different drawings represents the same or similar element unless otherwise indicated. Described implementations in the following illustrative examples do not represent all implementations consistent with the disclosure. Rather, they are only examples of an apparatus and method consistent with some aspects of the disclosure as detailed in the appended claims.

If a terminal works under a certain wider frequency band, the PA will work in a working state to which an Average Power Tracking (APT) mode corresponds all the time, which causes high power consumption of the terminal and then reduces endurance of the terminal.

In the related art, an APT mode corresponds to only two working states of a PA, for example, as shown in Table 1.

TABLE 1

| Working state of the PA | Output power range of the PA | Working mode |
|---|---|---|
| PA state1 | PA range0 | APT |
| PA state0 | PA range1 | APT |

PA state1 may correspond to a High Power Mode (HPM) so that various radio frequency indexes of a terminal can be met. PA state0 may correspond to using a Low Power Mode (LPM) so that power consumption of the terminal can be considered while it is lower-power output.

If the terminal adopts the PA provided by a third party on a system platform, a channel bandwidth in which the terminal works is larger than or equal to a certain threshold, for example, in a case of 60 MHz, the PA works in the APT mode, that is, the PA works in a working state of state0-PA range1 APT (corresponding to the LPM) shown in Table 1, or works in a working state of state1-PA range0 APT (corresponding to the HPM) shown in Table 1.

Under the condition that the channel bandwidth in which the terminal works is smaller than the threshold, the PA can work in any working state shown in Table 1, or work in a working state (state2-PA range0 ET) to which an ET mode corresponds.

When the system platform performs parameter setting, the total quantity of working states to which the PA corresponds specific to the same frequency band is fixed and unchanged and is 2 or 3 in general, so under the condition that the channel bandwidth covered by the frequency band is wide, though the channel bandwidth in which the terminal works is smaller than the above threshold, the terminal can work only in the APT mode all the time once the total quantity of the working states to which the PA corresponds set by the system platform is 2.

Although the total quantity of the working states to which the PA corresponds set by the system platform meets the demand, under the condition that the channel bandwidth in which the terminal works is larger than or equal to the above threshold, the PA still works in the APT mode all the time, which causes high power consumption of the terminal and then reduces endurance of the terminal.

In view of this, the disclosure provides a working state adjustment method and apparatus, a terminal and a storage medium.

In order to solve the above technical problem, the disclosure provides the following working state adjustment solutions.

FIG. 1 is a flowchart of a working state adjustment method shown by an illustrative example of the disclosure. The example is described from a terminal side. A terminal includes but is not limited to a mobile phone, a laptop, a desktop computer, an Ipad, etc. A PA is arranged on the terminal. As shown in FIG. 1, the working state adjustment method includes the following steps.

In step 101, a target channel bandwidth in which the terminal works is determined.

In the example of the disclosure, the terminal can work in different frequency bands, and each of the frequency bands may cover at least one channel bandwidth. Taking an N41 frequency band for example, the N41 frequency band covers channel bandwidths of 20, 30, 40, 50, 60, 70, 80, 90 and 100 megahertz (MHz).

In step 102, a target working state in which the PA works is determined among optional working states according to the target channel bandwidth. The optional working states correspond to at least two types of working modes respectively.

In the example of the disclosure, the PA can be switched in working states to which the at least two types of working modes correspond.

In step 103, the PA is adjusted to work in the target working state.

In the above example, the PA can be switched in the working states to which the at least two types of working modes correspond, so that a problem of high power consumption of the terminal caused when the PA works in a working state to which the same working mode corresponds is avoided, power consumption of the terminal is reduced, and endurance of the terminal is improved.

In some optional examples, the at least two types of working modes include: a first working mode for adjusting a power supply voltage based on output power, and a second working mode for adjusting the output power based on the power supply voltage.

That is, the first working mode may be an APT mode, and the power supply voltage of the PA is adjusted according to the output power of the PA. The second working mode may be an Envelop Tracking (ET) mode, and the output power of the PA is controlled by adjusting the power supply voltage of the PA. The second working mode enables the PA to be in a working state saturated as much as possible.

The above description is only illustrative, during actual application, the at least two types of working modes may further include other PA working modes, which is not limited by the disclosure.

Figure 2:
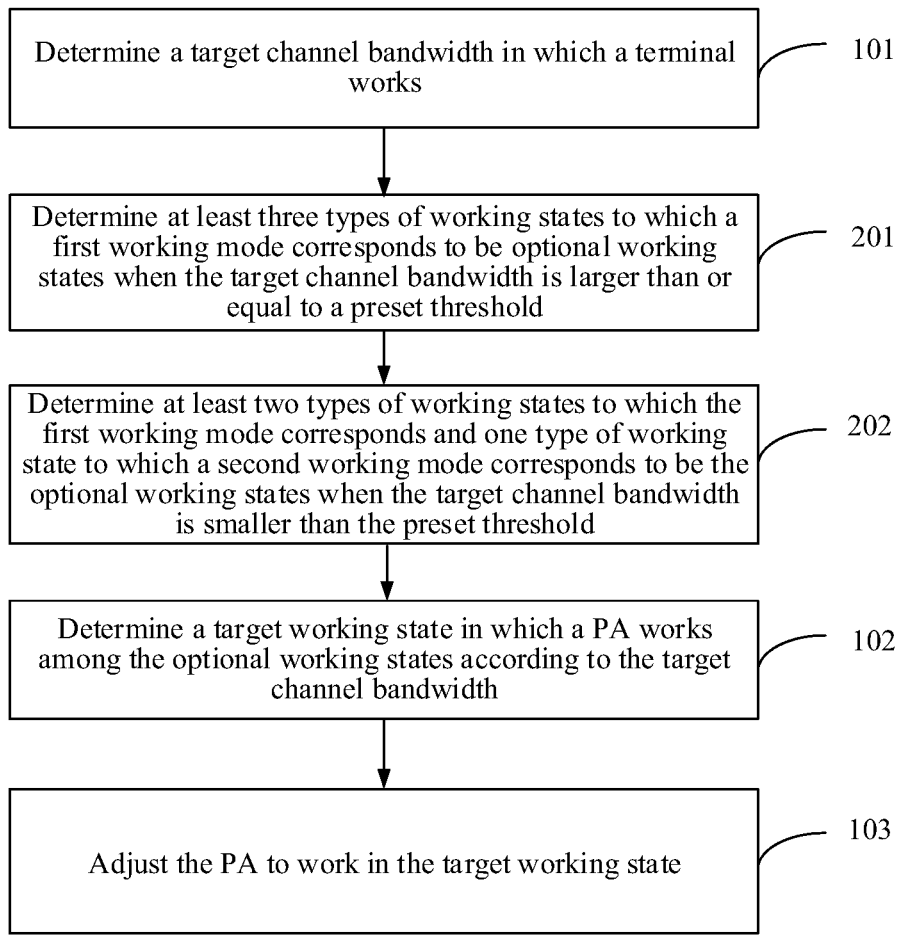
FIG. 2 is a flowchart of another working state adjustment method shown by an illustrative example of the disclosure.

Correspondingly, referring to FIG. 2, which is a flowchart of another working state adjustment method shown on the basis of an example shown in FIG. 1 of the disclosure. Before the above step 102 is executed, the method may further include the following steps.

In step 201, at least three types of working states to which the first working mode corresponds is determined to be the optional working states when the target channel bandwidth is larger than or equal to a preset threshold.

In the example of the disclosure, the preset threshold may be set to be 60 MHz, or certainly may be set according to a frequency band in which the terminal actually works, for example, the frequency band in which the terminal works covers the channel bandwidths of 20, 30, . . . 60 MHz, the preset threshold may be set to be 40 MHz, which is an example and not intended to limit the disclosure.

Under the condition that the target channel bandwidth in which the terminal works at present is larger than or equal to the preset threshold, the terminal can determine the at least three types of working states to which the above first working mode corresponds to be the optional working states.

In the example of the disclosure, when the total quantity of the working states to which the first working mode corresponds is larger than two, for example, the total quantity is 3, the working states to which the first working mode corresponds may include: a first working state corresponding to a low power mode, a second working state corresponding to a high power mode and a third working state corresponding to the high power mode.

That is, specific to the first working mode, the disclosure sets the new third working state, which, hypothetically, is PA state2', so that the first working mode can correspond to at least three types of working states, correspondingly, Table 1 can be updated to be Table 2.

TABLE 2

| Working state of the PA | Output power range of the PA | Working mode |
| --- | --- | --- |
| PA state2' | PA range0 | APT |
| PA state1 | PA range0 | APT |
| PA state0 | PA range1 | APT |

In Table 2, a power range to which PA state2' corresponds may be the same as a power range to which PA state1 corresponds, or a minimum value of the power range to which the PA state2' corresponds may be larger than a maximum value of the power range to which PA state1 corresponds, which is not limited by the disclosure.

In the disclosure, the new working state, namely PA state2', is set specific to the APT mode. Under the condition that the target channel bandwidth in which terminal works is larger or equal to the preset threshold, the working states indicated in Table 2 can be determined to be the optional working states.

In step 202, when the target channel bandwidth is smaller than the preset threshold, at least two types of working states to which the first working mode corresponds and one type of working state to which the second working mode corresponds are determined to be the optional working states.

In the example of the disclosure, the at least two types of working states to which the first working mode corresponds may include but are not limited to the first working state corresponding to the low power mode and the second working state corresponding to the high power mode.

If the target channel bandwidth in which the terminal works is smaller than the preset threshold, working states shown in Table 3 can be determined to be the optional working states.

TABLE 3

| Working state of the PA | Output power range of the PA | Working mode |
| --- | --- | --- |
| PA state2 | PA range0 | ET |
| PA state1 | PA range0 | APT |
| PA state0 | PA range1 | APT |

In the above example, on the basis of the target channel bandwidth in which the terminal works, the at least three types of working states to which the first working mode corresponds can be determined to be the optional working states, or the at least two types of working states to which the first working mode corresponds and the one type of working state to which the second working mode corresponds can be determined to be the optional working states. Accordingly, the target working state of the PA can be determined subsequently among the optional working states. The objective of adjusting and switching the PA in the working states to which the at least two types of working modes correspond is realized, the problem of high power consumption of the terminal caused when the PA works in a working state to which the same working mode corresponds is avoided, and endurance of the terminal is improved.

In some optional examples, it can be seen on the basis of above Table 2 and Table 3 that when the terminal works in the same wide frequency band, the total quantity of the optional working states to which the PA corresponds is the same and may be larger than or equal to 3. Correspondingly, when the total quantity of the optional working states to which the PA corresponds can be set by a system platform of the terminal, the total quantity is set to be 3. Accordingly, it can be guaranteed that the PA can be switched in the working states to which the at least two types of working modes correspond.

Figure 3:
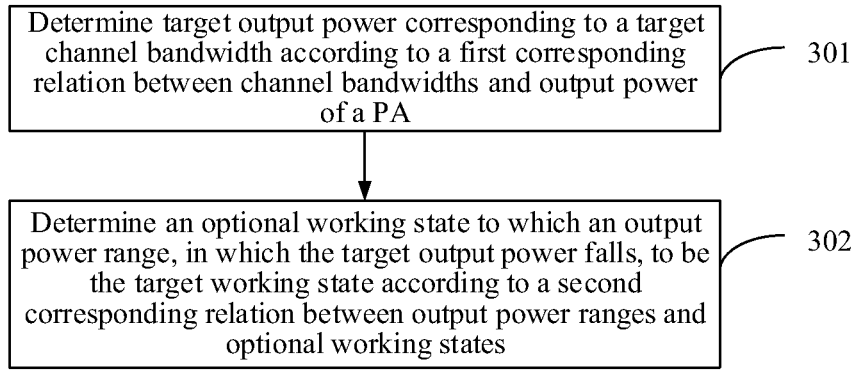
FIG. 3 is a flowchart of another working state adjustment method shown by an illustrative example of the disclosure.

In some optional examples, referring to FIG. 3, which is a flowchart of another working state adjustment method shown on the basis of an example shown in FIG. 2 of the disclosure. The above step 102 may include the following steps.

In step 301, target output power corresponding to the target channel bandwidth is determined according to a first corresponding relation between channel bandwidths and output power of the PA.

In the example of the disclosure, the above first corresponding relation can be determined through calibration of the PA. For example, the first corresponding relation includes: the output power corresponding to the PA is 23 dB when the channel bandwidth is 30 MHz.

The terminal can directly call the first corresponding relation according to the above pre-determined first corresponding relation during actual work so as to determine the target output power corresponding to the target channel bandwidth in which the terminal works.

In step 302, an optional working state to which an output power range, in which the target output power falls, is determined to be the target working state according to a second corresponding relation between output power ranges and the optional working states.

In the example of the disclosure, under the condition that the target channel bandwidth is larger than or equal to the preset threshold, the target working state corresponding to the output power range in which the target output power falls can be determined among the at least three types of working states to which the first working mode corresponds according to the second corresponding relation indicated in Table 2.

Under the condition that the target channel bandwidth is smaller than the preset threshold, the target working state corresponding to the output power range in which the target output power falls is determined among the at least two types of working states to which the first working mode corresponds and the working state to which the second working mode corresponds according to the second corresponding relation indicated in Table 3.

In the above example, the target working state can be rapidly determined, implementation is easy and convenient, and applicability is high.

In some optional examples, the PA can be calibrated alternatively before the terminal leaves the factory so that the above first corresponding relation can be determined. Specifically, in each working state to which each working mode corresponds, the PA can be calibrated on the basis of a calibration parameter to which the working state corresponds so that the above first corresponding relation can be determined according to a calibration result.

In the example of the disclosure, the calibration parameter includes but is not limited to a voltage bias value, a current bias value, an output power index, etc.

In a possible implementation, in a PA calibration process, channel bandwidths corresponding to output power indicated by different output power indexes need to be calibrated.

In the example of the disclosure, the PA needs to be calibrated on the basis of the calibration parameter to which the each working state corresponds in the three working states to which the first working mode corresponds. Likewise, the PA further needs to be calibrated on the basis of the corresponding calibration parameter in the working state to which the second working mode corresponds.

A parameter value of the calibration parameter to which the second working state corresponds may be the same as a parameter value of the calibration parameter to which the third working state corresponds.

In the above example, the PA can be calibrated before the terminal leaves the factory so that the first corresponding relation between the channel bandwidths and the output power of the PA can be determined. The parameter value of the calibration parameter to which the second working state corresponds may be the same as the parameter value of the calibration parameter to which the third working state corresponds. Implementation is easy and convenient, and applicability is high.

Corresponding to the aforementioned example of the disclosure function implementation method, the disclosure further provides an example of a disclosure function implementation apparatus.

Figure 4:
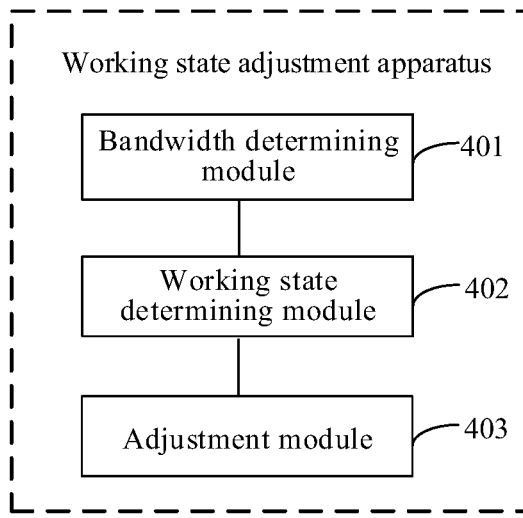
FIG. 4 is a block diagram of a working state adjustment apparatus shown according to an illustrative example.

Referring to FIG. 4, which is a block diagram of a working state adjustment apparatus shown according to an illustrative example. The apparatus is applied to a terminal. A power amplifier (PA) is arranged on the terminal. The apparatus includes:
 a bandwidth determining module 401, configured to determine a target channel bandwidth in which the terminal works;
 a working state determining module 402, configured to determine a target working state in which the PA works among optional working states according to the target channel bandwidth, in which the optional working states correspond to at least two types of working modes respectively; and
 an adjustment module 403, configured to adjust the PA to work in the target working state.

In some optional examples, the at least two types of working modes include: a first working mode for adjusting a power supply voltage based on output power, and a second working mode for adjusting the output power based on the power supply voltage.

In some optional examples, the apparatus further includes:

an optional working state determining module, configured to determine at least three types of working states to which the first working mode corresponds to be the optional working states when the target channel bandwidth is larger than or equal to a preset threshold; and determine at least two types of working states to which the first working mode corresponds and one type of working state to which the second working mode corresponds to be the optional working states when the target channel bandwidth is smaller than the preset threshold.

In some optional examples, the working states to which the first working mode corresponds at least include:

a first working state corresponding to a low power mode and a second working state corresponding to a high power mode.

When the total quantity of the working states to which the first working mode corresponds is larger than two, the working states to which the first working mode corresponds further includes:

a third working state corresponding to the high power mode.

In some optional examples, the working state determining module is further configured to:

determine target output power corresponding to the target channel bandwidth according to a first corresponding relation between channel bandwidths and output power of the PA; and determine an optional working state to which an output power range, in which the target output power falls, corresponds to be the target working state according to a second corresponding relation between output power ranges and the optional working states.

In some optional examples, the apparatus further includes:

a calibrating module, configured to calibrate the PA on the basis of a calibration parameter to which each working state corresponds in each working state to which each working mode corresponds; and a processing module, configured to determine the first corresponding relation on the basis of a calibration result of calibrating the PA.

In some optional examples, a parameter value of the calibration parameter to which the second working state corresponds is the same as a parameter value of the calibration parameter to which the third working state corresponds.

In some optional examples, the total quantity of the optional working states is larger than or equal to 3.

As for the example of the apparatus, as the example of the apparatus basically corresponds to an example of a method, related parts may refer to a part of description of the example of the method. The example of the apparatus described above is only illustrative, units described as separated components above may be physically separated or not, and components displayed as units may be physical units or not, that is, may be located in one place or distributed on a plurality of network units. Objectives of the solutions of the disclosure can be realized by selecting part of or all of the modules according to actual demands. Those ordinarily skilled in the art can understand and implement them without creative work.

Figure 5:
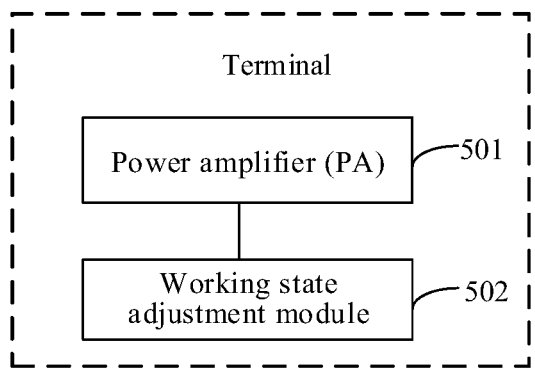
FIG. 5 is a block diagram of a terminal shown according to an illustrative example.

Correspondingly, referring to FIG. 5, which is a block diagram of a terminal shown according to an illustrative example. The terminal includes:

a power amplifier (PA) 501; and a working state adjustment module 502, configured to adjust working states of the PA by using any method above.

In some optional examples, the terminal further includes:

a system platform, configured to set the total quantity of optional working states to which the PA corresponds specific to any of frequency bands in which the terminal works.

In some optional examples, the total quantity of the optional working states set by the system platform is larger than or equal to 3.

Correspondingly, the disclosure further provides a computer readable storage medium, configured to store a computer program. When the computer program is executed by a processor, steps of any working state adjustment method above are implemented.

Correspondingly, the disclosure further provides a working state adjustment apparatus, including:

a processor; and a memory, configured to store an instruction executable by the processor.

The processor is configured to execute the executable instruction so as to implement steps of any above working state adjustment method.

Figure 6:
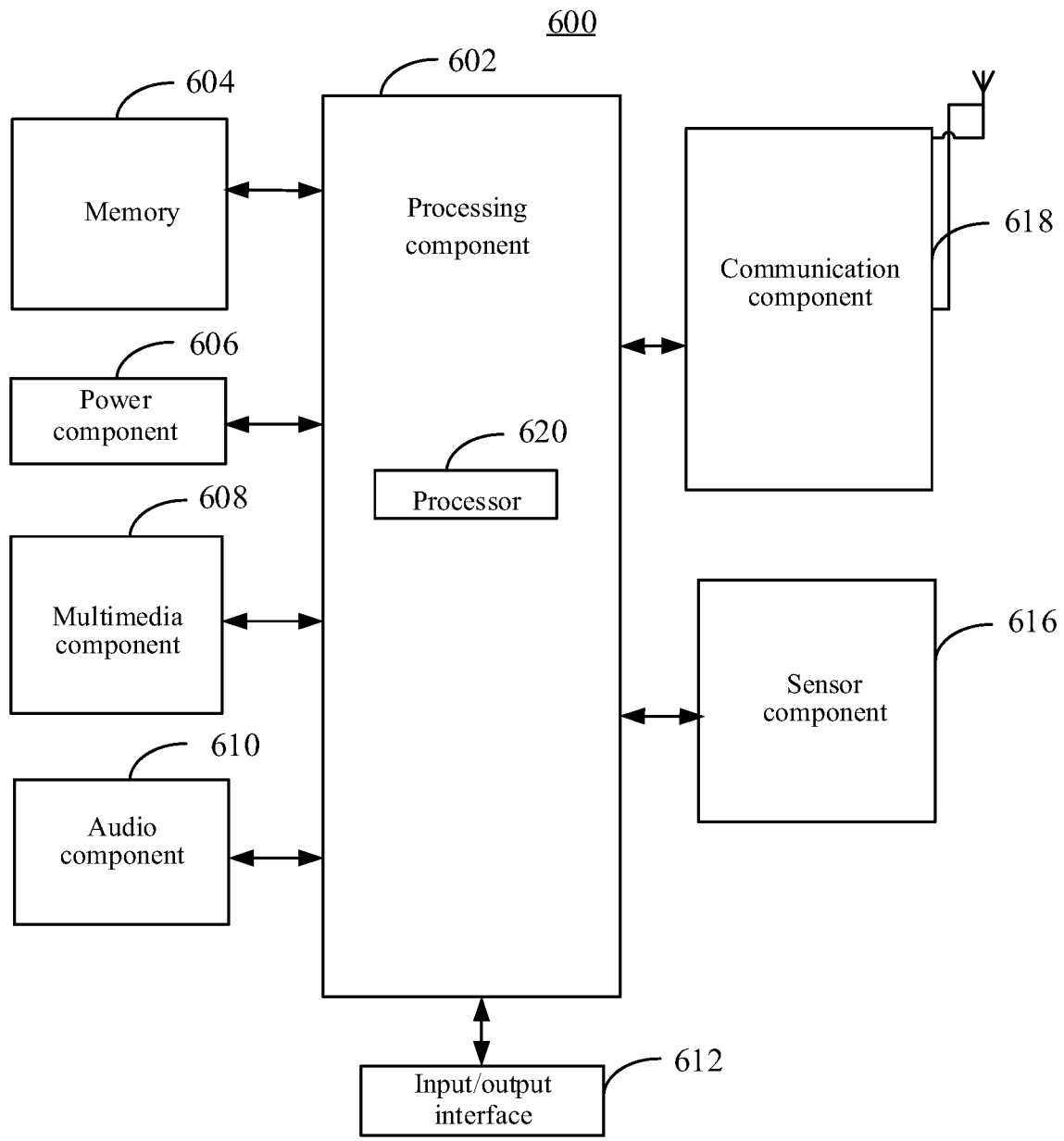
FIG. 6 is a block diagram of a working state adjustment apparatus shown according to an illustrative example.

FIG. 6 is a block diagram of a working state adjustment apparatus shown according to an illustrative example. For example, the apparatus 600 may be a mobile phone, a computer, a digital broadcast terminal, a messaging device, a game console, a tablet device, a medical device, a fitness facility, a personal digital assistant and other terminals.

Referring to FIG. 6, the apparatus 600 may include one or more components as follows: a processing component 602, a memory 604, a power component 606, a multimedia component 608, an audio component 610, an input/output (I/O) interface 612, a sensor component 616 and a communication component 618.

The processing component 602 generally controls the whole operation of the apparatus 600, such as operations related to display, phone calls, data communication, camera operation and recording operation. The processing component 602 may include one or more processors 620 for executing instructions so as to complete all or part of steps of the above method. The processing component 602 may include one or more modules to facilitate interaction between the processing component 602 and the other components. For example, the processing component 602 may include a multimedia module so as to facilitate interaction between the multimedia component 608 and the processing component 602.

One of processors 620 in the processing component 602 may be configured to execute the above working state adjustment method.

The memory 604 is configured to store various data so as to support operations on the apparatus 600. Instances of these data include instructions of any disclosure program or method for operation on the apparatus 600, contact person data, telephone directory data, messages, pictures, videos and the like. The memory 604 may be realized by any type of volatile or non-volatile storage device or their combination, such as a Static Random Access Memory (SRAM), an Electrically Erasable Programmable Read-only Memory (EEPROM), an Erasable Programmable Read-only Memory (EPROM), a Programmable Read-only Memory (PROM), a Read-only Memory (ROM), a magnetic memory, a flash memory, a magnetic disk or a compact disc.

The power component 606 provides power for the various components of the apparatus 600. The power component 606 may include a power management system, one or more power sources, and other components related to generation, management and distribution of power for the apparatus 600.

The multimedia component 608 includes a screen which provides an output interface between the apparatus 600 and a user. In some examples, the screen may include a Liquid Crystal Display (LCD) and a Touch Panel (TP). If the screen includes the touch panel, the screen may be realized as a touch screen so as to receive an input signal from the user. The touch panel includes one or more touch sensors so as to sense touching, swiping and gestures on the touch panel. The touch sensor can not only sense a boundary of a touching or swiping action, but also detect duration and pressure related to touching or swiping operation. In some examples, the multimedia component 608 includes a front camera and/or a back camera. When the apparatus 600 is in an operation mode, such as a photographing mode or a video mode, the front camera and/or the back camera can receive external multimedia data. Each front camera and each back camera may be a fixed optical lens system or have a focal length and an optical zoom capability.

The audio component 610 is configured to output and/or input an audio signal. For example, the audio component 610 includes a microphone (MIC). When the apparatus 600 is in the operation mode, such as a call mode, a recording mode and a voice recognition mode, the microphone is configured to receive an external audio signal. The received audio signal may be further stored in the memory 604 or sent via the communication component 618. In some examples, the audio component 610 further includes a speaker for outputting the audio signal.

The I/O interface 612 provides an interface between the processing component 602 and a peripheral interface module, and the peripheral interface module may be a keyboard, a click wheel, buttons and the like. These buttons may include but are not limited to: a home button, a volume button, a start button and a lock button.

The sensor component 616 includes one or more sensors, configured to provide state evaluation of various aspects for the apparatus 600. For example, the sensor component 616 may detect a start/shut-down state of the apparatus 600 and relative positioning of the components, for example, the components are a display and a keypad of the apparatus 600. The sensor component 616 may further detect a position change of the apparatus 600 or one component of the apparatus 600, whether there is contact between the user and the apparatus 600, and an azimuth or speeding-up/speeding-down of the apparatus 600 and a temperature change of the apparatus 600. The sensor component 616 may include a proximity sensor, configured to detect existence of a nearby object without any physical contact. The sensor component 616 may further include an optical sensor, such as a CMOS or CCD image sensor, for use in imaging application. In some examples, the sensor component 616 may further include an acceleration sensor, a gyroscope sensor, a magnetic sensor, a pressure sensor or a temperature sensor.

The communication component 618 is configured to facilitate wired or wireless communication between the apparatus 600 and the other devices. The apparatus 600 may be accessed to a wireless network based on a communication standard, such as WiFi, 3G, 4G, 5G, 6G or their combination. In an illustrative example, the communication component 618 receives a broadcast signal or related broadcast information from an external broadcast management system via a broadcast channel. In an illustrative example, the communication component 618 further includes a near-field communication (NFC) module so as to facilitate short-range communication. For example, the NFC module may be realized based on a radio frequency identification (RFID) technology, an Infra-Red Data Association (IrDA) technology, an ultra wide band (UWB) technology, a Bluetooth (BT) technology and other technologies.

In the illustrative example, the apparatus 600 may be realized by one or more application specific integrated circuits (ASICs), digital signal processors (DSPs), digital signal processing devices (DSPDs), programmable logic devices (PLDs), field-programmable gate arrays (FPGAs), controllers, micro controller, microprocessors or other electronic elements for executing the above method.

In an illustrative example, a non-transitory computer readable storage medium including instructions is further provided, such as a memory 604 including the instructions. The instructions may be executed by the processor 620 of an apparatus 600 so as to complete the above method. For example, the non-transitory computer readable storage medium may be an ROM, a random access memory (RAM), a CD-ROM, a magnetic tape, a floppy disk, an optical data storage device and the like.

It needs to be stated that relation terms such as "first" and "second" herein are only used for distinguishing one entity or operation from another entity or operation rather than necessarily require or imply that these entities or operations have any actual relation or sequence like this. A term "include", "comprise" or any of its variants intends to cover non-exclusive containing, so that a process, method, item or device including a series of elements can not only include those elements, but also include other elements not listed clearly, or may further include inherent elements of the process, method, item or device. Without more limits, as for an element limited by a statement "include a/an . . . ", it is not excluded that the process, method, item or device including the element still has other same elements.

Those skilled in the art will easily figure out other implementation solutions of the disclosure after considering the specification and practicing the disclosure disclosed herein. The disclosure intends to cover any transformation, application or adaptive change of the disclosure which conforms to a general principle of the disclosure and includes common general knowledge or conventional technical means which are not disclosed by the disclosure in the technical field. The specification and the examples are regarded as illustrative, and the true scope and spirit of the disclosure are indicated by the following claims.

It can be understood that the disclosure is not limited to an accurate structure described above and shown in the drawings and various modifications and changes can be made without departing from its scope. The scope of the disclosure is limited by the appended claims.

Additional non-limiting embodiments of the disclosure include:

1. A working state adjustment method, applied to a terminal, a power amplifier (PA) is arranged on the terminal and the method includes:
   determining a target channel bandwidth in which the terminal works;

determining a target working state in which the PA works among optional working states according to the target channel bandwidth, wherein the optional working states correspond to at least two types of working modes respectively; and adjusting the PA to work in the target working state.

2. The working state adjustment method according to embodiment 1, where the at least two types of working modes includes: a first working mode for adjusting a power supply voltage based on output power, and a second working mode for adjusting the output power based on the power supply voltage.

3. The working state adjustment method according to any of embodiments 1-2, where before determining the target working state in which the PA works among the optional working states according to the target channel bandwidth, further includes:

determining at least three types of working states to which the first working mode corresponds to be the optional working states when the target channel bandwidth is larger than or equal to a preset threshold; and determining at least two types of working states to which the first working mode corresponds and one type of working state to which the second working mode corresponds to be the optional working states when the target channel bandwidth is smaller than the preset threshold.

4. The working state adjustment method according to any of embodiments 1-3, where the working states to which the first working mode corresponds at least includes:

a first working state corresponding to a low power mode and a second working state corresponding to a high power mode; and when the total quantity of the working states to which the first working mode corresponds is larger than two, the working states to which the first working mode corresponds further comprise:

a third working state corresponding to the high power mode.

5. The working state adjustment method according to any of embodiments 1-4, where determining the target working state among the optional working states according to the target channel bandwidth includes:

determining target output power corresponding to the target channel bandwidth according to a first corresponding relation between channel bandwidths and output power of the PA; and determining an optional working state to which an output power range, in which the target output power falls, corresponds to be the target working state according to a second corresponding relation between output power ranges and the optional working states.

6. The working state adjustment method according to any of embodiment 5, before determining the target output power corresponding to the target channel bandwidth according to the first corresponding relation between the channel bandwidths and the output power of the PA, further including:

calibrating the PA on the basis of a calibration parameter to which each working state corresponds in each working state to which each working mode corresponds; and determining the first corresponding relation on the basis of a calibration result of calibrating the PA.

7. The working state adjustment method according to any of embodiment 6, where a parameter value of the calibration parameter to which the second working state corresponds is the same as a parameter value of the calibration parameter to which the third working state corresponds.

8. The working state adjustment method according to any of embodiments 1-7, where the total quantity of the optional working states is larger than or equal to 3.

9. A terminal, including:

a power amplifier (PA); and a working state adjustment module, configured to adjust a working state of the PA by using the method according to any of embodiments 1-8.

10. The terminal according to embodiment 9, further including:

a system platform, configured to set the total quantity of optional working states to which the PA corresponds specific to any of frequency bands in which the terminal works.

11. A computer readable storage medium, storing a computer program, when the computer program is executed by a processor, steps of the working state adjustment method according to any of embodiments 1-8 are implement.

12. A working state adjustment apparatus, including:

a processor; and a memory, configured to store an instruction executable by the processor, where the processor is configured to execute the executable instruction so as to implement steps of the working state adjustment method according to any of embodiments 1-8.

What is claimed is:

1. A working state adjustment method, applied to a terminal, wherein a power amplifier (PA) is arranged on the terminal and the method comprises:

determining a target channel bandwidth in which the terminal works;

determining optional working states according to a comparison result between the target channel bandwidth and a preset threshold;

determining a target working state in which the PA works among the optional working states according to the target channel bandwidth, wherein the optional working states correspond to at least two types of working modes respectively; and adjusting the PA to work in the target working state.

2. The method according to claim 1, wherein the at least two types of working modes comprise: a first working mode for adjusting a power supply voltage based on output power, and a second working mode for adjusting the output power based on the power supply voltage.

3. The method according to claim 2, wherein determining optional working states according to a comparison result between the target channel bandwidth and a preset threshold comprises:

determining at least three types of working states to which the first working mode corresponds to be the optional working states when the target channel bandwidth is larger than or equal to a preset threshold; and according determining at least two types of working states to which the first working mode corresponds and one type of working state to which the second working mode corresponds to be the optional working states when the target channel bandwidth is smaller than the preset threshold.

4. The method according to claim 2, wherein the working states to which the first working mode corresponds at least comprise:

a first working state corresponding to a low power mode and a second working state corresponding to a high power mode; and when the total quantity of the working states to which the first working mode corresponds is larger than two, the working states to which the first working mode corresponds further comprise:

a third working state corresponding to the high power mode.

5. The method according to claim 4, wherein determining the target working state among the optional working states according to the target channel bandwidth comprises:

determining target output power corresponding to the target channel bandwidth according to a first corresponding relation between channel bandwidths and output power of the PA; and determining an optional working state to which an output power range, in which the target output power falls, corresponds to be the target working state according to a second corresponding relation between output power ranges and the optional working states.

6. The method according to claim 5, wherein before determining the target output power corresponding to the target channel bandwidth according to the first corresponding relation between the channel bandwidths and the output power of the PA, performing the steps of:

calibrating the PA on the basis of a calibration parameter to which each working state corresponds in each working state to which each working mode corresponds; and determining the first corresponding relation on the basis of a calibration result of calibrating the PA.

7. The method according to claim 6, wherein a parameter value of the calibration parameter to which the second working state corresponds is the same as a parameter value of the calibration parameter to which the third working state corresponds.

8. The method according to claim 1, wherein the total quantity of the optional working states is larger than or equal to 3.

9. A terminal, comprising:

a power amplifier (PA); and a working state adjustment module, configured to adjust a working state of the PA by:

determining a target channel bandwidth in which the terminal works;

determining optional working states according to a comparison result between the target channel bandwidth and a preset threshold;

determining a target working state in which the PA works among the optional working states according to the target channel bandwidth, wherein the optional working states correspond to at least two types of working modes respectively; and adjusting the PA to work in the target working state.

10. The terminal according to claim 9, further comprising:

a system platform, configured to set the total quantity of optional working states to which the PA corresponds specific to any of frequency bands in which the terminal works.

11. The terminal according to claim 9, wherein the at least two types of working modes comprise: a first working mode for adjusting a power supply voltage based on output power, and a second working mode for adjusting the output power based on the power supply voltage.

12. The terminal according to claim 11, wherein the working state adjustment module is further configured to adjust a working state of the PA by:

determining at least three types of working states to which the first working mode corresponds to be the optional working states when the target channel bandwidth is larger than or equal to a preset threshold; and determining at least two types of working states to which the first working mode corresponds and one type of working state to which the second working mode corresponds to be the optional working states when the target channel bandwidth is smaller than the preset threshold.

13. The terminal according to claim 11, wherein the working states to which the first working mode corresponds at least comprise:

a first working state corresponding to a low power mode and a second working state corresponding to a high power mode; and when the total quantity of the working states to which the first working mode corresponds is larger than two, the working states to which the first working mode corresponds further comprise:

a third working state corresponding to the high power mode.

14. The terminal according to claim 13, wherein determining the target working state among the optional working states according to the target channel bandwidth comprises:

determining target output power corresponding to the target channel bandwidth according to a first corresponding relation between channel bandwidths and output power of the PA; and determining an optional working state to which an output power range, in which the target output power falls, corresponds to be the target working state according to a second corresponding relation between output power ranges and the optional working states.

15. The terminal according to claim 14, wherein before determining the target output power corresponding to the target channel bandwidth according to the first corresponding relation between the channel bandwidths and the output power of the PA, the working state adjustment module is further configured to adjust a working state of the PA by:

calibrating the PA on the basis of a calibration parameter to which each working state corresponds in each working state to which each working mode corresponds; and determining the first corresponding relation on the basis of a calibration result of calibrating the PA.

16. The terminal according to claim 15, wherein a parameter value of the calibration parameter to which the second working state corresponds is the same as a parameter value of the calibration parameter to which the third working state corresponds.

17. The terminal according to claim 9, wherein the total quantity of the optional working states is larger than or equal to 3.

18. A computer readable storage medium, storing a computer program, wherein when the computer program is executed by a processor, implements:

determining a target channel bandwidth in which the terminal works;

determining optional working states according to a comparison result between the target channel bandwidth and a preset threshold;

determining a target working state in which the PA works among the optional working states according to the target channel bandwidth, wherein the optional working states correspond to at least two types of working modes respectively; and adjusting the PA to work in the target working state.

19. A working state adjustment apparatus, comprising:
a processor; and
a memory, configured to store an instruction executable by the processor, wherein
the processor is configured to execute the executable instruction so as to implement steps of the working state adjustment method according to claim 1.

* * * * *